(12) United States Patent
Nakura et al.

(10) Patent No.: US 6,472,712 B1
(45) Date of Patent: *Oct. 29, 2002

(54) SEMICONDUCTOR DEVICE WITH REDUCED TRANSISTOR LEAKAGE CURRENT

(75) Inventors: Toru Nakura, Hyogo (JP); Kimio Ueda, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/357,922

(22) Filed: Jul. 21, 1999

(30) Foreign Application Priority Data

Jan. 28, 1999 (JP) .......................................... 11-020221

(51) Int. Cl.[7] .............................................. H01L 29/76
(52) U.S. Cl. ........................ 257/369; 257/347; 257/350; 257/369; 257/373; 257/376; 257/371; 257/372; 257/377; 257/384; 438/100; 438/208
(58) Field of Search ................................ 257/369, 373, 257/376, 347, 350, 364, 371, 372, 377, 384; 438/199, 208

(56) References Cited

U.S. PATENT DOCUMENTS

| | | | | |
|---|---|---|---|---|
| 4,160,987 A | * | 7/1979 | Dennard et al. ............... 357/41 |
| 5,804,858 A | * | 9/1998 | Hsue et al. ................... 257/347 |
| 5,952,701 A | * | 9/1999 | Bulucea et al. ............... 257/407 |
| 5,965,919 A | * | 10/1999 | Yoo ............................. 257/351 |
| 6,049,113 A | * | 4/2000 | Shida ........................... 257/369 |
| 6,064,096 A | * | 5/2000 | Son ............................. 257/368 |
| 6,144,076 A | * | 11/2000 | Puchner et al. ............... 257/369 |
| 6,153,453 A | * | 11/2000 | Jimenez ........................ 438/200 |
| 6,153,455 A | * | 11/2000 | Ling et al. ................... 438/231 |

OTHER PUBLICATIONS

"A CAD–Compatibe SOI/CMOS Gate Array having Body–Fixed Partially–Depleted Transistors," K. Ueda, et al., 1997 IEEE International Solid State Circuits Conference, pp. 288–289.

* cited by examiner

Primary Examiner—Eddie Lee
Assistant Examiner—Edgardo Ortiz
(74) Attorney, Agent, or Firm—McDermott, Will & Emery

(57) ABSTRACT

A semiconductor device improved to suppress a leakage current of a transistor is provided. A gate electrode is disposed on a semiconductor substrate. A pair of p type source/drain layers are provided on the surface of the semiconductor substrate, on both sides of the gate electrode in the gate length direction Y. An n type gate width determining layer is provided on the surface of the semiconductor substrate to sandwich the source/drain layers in the width direction X of the gate electrode, which determines a gate width of the gate electrode. The source/drain layers and the gate width determining layer are isolated by PN junction.

11 Claims, 7 Drawing Sheets

SEMICONDUCTOR DEVICE WITH REDUCED TRANSISTOR LEAKAGE CURRENT

BACKGROUND OF THE INVENTION

1. Field of the Invention

The present invention generally relates to a semiconductor device, and more particularly to a semiconductor integrated circuit improved to reduce a leakage current of a transistor. The present invention also relates to a manufacturing method of such a semiconductor device.

2. Description of the Background Art

Conventionally, a LOCOS oxide film has been used to determine a gate width of a gate electrode of a transistor.

FIG. 10 is a top plan view of a transistor having a gate electrode with its gate width determined by such a LOCOS oxide film. FIG. 11 is a cross sectional view taken along the line XI—XI in FIG. 10.

Referring to FIGS. 10 and 11, an n well 2 and a p well 3 are provided in the main surface of a semiconductor substrate 1. A first gate electrode 5 is disposed on n well 2, with a gate oxide film 4 interposed therebetween. A second gate electrode 7 is disposed on p well 3, with a gate oxide film 6 interposed therebetween. A gate width $W_1$ of first gate electrode 5 is determined by a LOCOS oxide film 8. A gate width $W_2$ of second gate electrode 7 is also determined by LOCOS oxide film 8. A pair of p type source/drain layers 9 are disposed on the surface of semiconductor substrate 1, on both sides of first gate electrode 5 in the gate length direction Y. A pair of n type source/drain layers 10 are disposed on the surface of p well 3, on both sides of second gate electrode 7 in gate length direction Y. N well 2 is supplied with a potential of $V_{DD}$ via a body contact region 11, and p well 3 is grounded via a body contact region 12.

FIG. 12 is a cross sectional view of a transistor that is formed using a SOI (Silicon On Insulator) substrate. This transistor is identical to the transistor shown in FIG. 11, except that it employs the SOI substrate as its semiconductor substrate. Thus, the same or corresponding portions are denoted by the same reference numbers, and description thereof will not be repeated.

Note that the SOI substrate is a semiconductor substrate 1 with a silicon oxide film 13 buried therein.

FIG. 13 is a cross sectional view of a semiconductor device in which the gate width of a gate electrode is determined by a field shield, instead of determined by the LOCOS oxide film. Otherwise, its structure is identical to that of the conventional device shown in FIG. 11, and thus, the same or corresponding portions are denoted by the same reference numbers, and description thereof is not repeated.

FIG. 14 is a cross sectional view of a semiconductor device in which both the SOI substrate and the field shield are used in combination. Otherwise, it has the same structure as in the conventional device shown. in FIG. 11, and thus, the same reference numbers denote the same or corresponding portions, and description thereof is not repeated.

Now, a manufacturing method of the conventional semiconductor device shown in FIG. 11 will be described.

Referring to FIGS. 10 and 11, LOCOS oxide film 8 is formed on the surface of semiconductor substrate 1 by photolithography and a LOCOS method.

Thereafter, $N^-$ channel doping (e.g., with P, As) is performed to form n well 2, by photolithography and ion implantation. $P^-$ channel doping (with B, for example) is then performed to form p well 3 on the surface of semiconductor substrate 1, by photolithography and ion implantation. A gate oxide film and a gate electrode film are then formed, and the unnecessary films are removed by photolithography and etching, leaving the gate pattern. Gate oxide films 4, 6 and gate electrodes 5, 7 are thus formed.

A pair of p type source/drain layers 9 are formed on both sides of first gate electrode 5 in the gate length direction Y, by photolithography and ion implantation. A pair of n type source/drain layers 10 are formed on both sides of second gate electrode 7 in the gate length direction Y, by photolithography and ion implantation. A transistor with its gate width determined by LOCOS oxide film 8 is obtained through the above-described process.

The conventional semiconductor device and manufacturing method thereof have been configured as described above. Therefore, referring to FIG. 11, when forming LOCOS oxide film 8, a so-called bird's beak is formed on its end. The $N^-$ or $P^-$ channel doping results in a lightly doped portion immediately beneath such a bird's beak. To avoid this, semiconductor substrate 1 is often set askew at the time of channel doping, so as to prevent impurity concentration in this region from lowering. However, these impurities may be absorbed into the oxide film when heated in a subsequent process, which will result in lowered impurity concentration. Consequently, the threshold value of the transistor will be decreased, and the leakage current will be produced at the edge of the transistor.

Such increase in leakage current is considerable especially in the SOI device employing the SOI substrate as its semiconductor substrate, as shown in FIG. 12. More specifically, since the bird's beak region is sandwiched between LOCOS oxide film 8 and buried oxide film 13, a large amount of impurities are absorbed into those oxide films 8 and 13, and thus, the threshold value is considerably decreased, resulting in a significant increase in the leakage current.

One way to determine the gate width of a transistor while avoiding the formation of birds' beaks is to employ a field shield isolation 14, as shown in FIG. 13. When this technique is employed, however, gate electrodes 5, 7 are formed to have stepped structures, which may result in disconnection in the gate electrodes. In addition, the number of process steps increases with this technique.

Similar problems have been seen with the structure employing both the SOI substrate and the field shield isolation as shown in FIG. 14. Note that the same or corresponding portions in the above figures are denoted by the same reference numbers, and description thereof is not repeated.

SUMMARY OF THE INVENTION

The present invention is directed to solve the above-described problems. An object of the present invention is to provide a semiconductor device improved to reduce a leakage current of a transistor.

Another object of the present invention is to provide a manufacturing method of a semiconductor device improved to reduce the process steps.

The semiconductor device according to a first aspect of the present invention includes a semiconductor substrate. A gate electrode is provided on the semiconductor substrate. A pair of source/drain layers of the first conductivity type are disposed on the surface of the semiconductor substrate, on both sides of the gate electrode in the gate length direction. A gate width determining layer of the second conductivity type is disposed on the surface of the semiconductor substrate, which determines the gate width of the gate electrode. This gate width determining layer is disposed to sandwich the source/drain layers in the width direction of the gate electrode. The source/drain layers and the gate width determining layer are isolated by PN junction.

The semiconductor device according to the present invention has a structure that requires no LOCOS oxide film. Therefore, there occurs no impurity diffusion into the oxide films, or no bird's beak is produced. Accordingly, it is possible to suppress the leakage current.

According to a second aspect of the present invention, the semiconductor device is provided with a silicide prevention film on the semiconductor substrate, continuously on and along the boundary of the PN junction, to prevent formation of silicide thereunder.

According to the present invention, a reverse bias portion of PN junction is not silicified, and thus, there occurs no short between the power supply and the ground through the silicide.

According to a third aspect of the present invention, the semiconductor device is provided with a first conductivity type source/drain layer and a second conductivity type source/drain layer, disposed adjacent to each other. The semiconductor device includes a semiconductor substrate. A first gate electrode and a second gate electrode are disposed on the semiconductor substrate, adjacent to each other in their gate width direction. A pair of the first conductivity type source/drain layers are disposed on the surface of the semiconductor substrate, on both sides of the first gate electrode in the gate length direction. A first gate width determining layer of the second conductivity type for determining the gate width of the first gate electrode is disposed on the surface of the semiconductor substrate to sandwich the first conductivity type source/drain layers in the width direction of the first gate electrode. A pair of the second conductivity type source/drain layers are disposed on the surface of the semiconductor substrate, on both sides of the second gate electrode in the gate length direction. A second gate width determining layer of the first conductivity type for determining the gate width of the second gate electrode is disposed on the surface of the semiconductor substrate to sandwich the second conductivity type source/drain layers in the width direction of the second gate electrode. An oxide film is disposed on the surface of the semiconductor substrate, which isolates the first gate width determining layer from the second gate width determining layer.

According to the present invention, the NMOSFET and the PMOSFET can be isolated by the LOCOS oxide film. Therefore, it becomes possible to prevent a PN junction reverse bias current as well as a latch-up structure of PNPN.

The semiconductor device according to a fourth, fifth, or sixth aspect of the present invention has a SOI substrate as the semiconductor substrate.

According to the present invention, the leakage current can be prevented even when the SOI substrate is used.

In the manufacturing method of a semiconductor device according to a seventh aspect of the present invention, impurity ions of the first conductivity type are first introduced in the surface of the semiconductor substrate to form an impurity layer extending in a horizontal direction. A gate electrode is formed on the semiconductor substrate. Impurity ions of the second conductivity type are introduced selectively in a predetermined gate width region on both sides of the gate electrode in the gate length direction. Thus, a pair of source/drain layers of the second conductivity type are formed on both sides of the gate electrode in the gate length direction. A gate width determining layer of the first conductivity type for determining the gate width of the gate electrode is also formed, which sandwiches the source/drain layers of the second conductivity type in the gate width direction and is isolated from the source/drain layers of the second conductivity type by PN junction.

According to the present invention, no LOCOS oxide film is used as a means to determine the gate width of gate electrode. Therefore, there occurs no impurity diffusion into the oxide films, or no bird's beak is formed. Thus, the leakage current can be suppressed.

In the manufacturing method of a semiconductor device according to an eighth aspect of the present invention, a silicide prevention film is formed on the semiconductor substrate, continuously on and along a boundary of the gate width determining layer of the first conductivity type and the source/drain layers of the second conductivity type, to prevent formation of silicide thereunder. The surface of the semiconductor substrate is silicified using the silicide prevention film as a mask.

According to the present invention, the silicide prevention film is formed on the semiconductor substrate, continuously on and along the boundary of the first conductivity type impurity layer and the second conductivity type source/drain layer. Therefore, short between the power supply and the ground can be prevented, even in the case where the surface of the semiconductor substrate is silicified thereafter.

In the manufacturing method of a semiconductor device according to a ninth aspect of the present invention, an oxide film is formed in the surface of the semiconductor substrate to separate the surface into a first surface and a second surface. Impurity ions of the first conductivity type are introduced in the first surface of the semiconductor substrate to form an impurity layer extending in a horizontal direction. Impurity ions of the second conductivity type are introduced in the second surface of the semiconductor substrate to form an impurity layer extending in a horizontal direction. A first gate electrode is formed on the first surface of the semiconductor substrate and a second gate electrode is formed on the second surface of the semiconductor substrate. Impurity ions of the second conductivity type are introduced selectively in a predetermined gate width region on both sides of the first gate electrode in the gate length direction to form a pair of source/drain layers of the second conductivity type on both sides of the first gate electrode in the gate length direction. A gate width determining layer of the first conductivity type for determining the gate width of the first gate electrode is also formed, which sandwiches the source/drain layers of the second conductivity type in the gate width direction and is isolated from the source/drain layers of the second conductivity type by PN junction. Impurity ions of the first conductivity type are introduced selectively in a predetermined gate width region on both sides of the second gate electrode in the gate length direction to form a pair of source/drain layers of the first conductivity type on both sides of the second gate electrode in the gate length direction. A gate width determining layer of the second conductivity type for determining the gate width of the second gate electrode is also formed, which sandwiches the source/drain layers of the first conductivity type in the gate width direction and is isolated from the source/drain layers of the first conductivity type by PN junction.

According to the present invention, the NMOSFET and the PMOSFET are isolated by the LOCOS isolation. Therefore, a PN junction reverse bias current can be prevented, and further, a latch-up structure of PNPN can be prevented.

According to a tenth, eleventh, or twelfth aspect of the present invention, the manufacturing method of a semiconductor device utilizes a SOI substrate as the semiconductor substrate.

With the method according to those aspects, a transistor that is capable of preventing a leakage current can be obtained even when the SOI substrate is used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
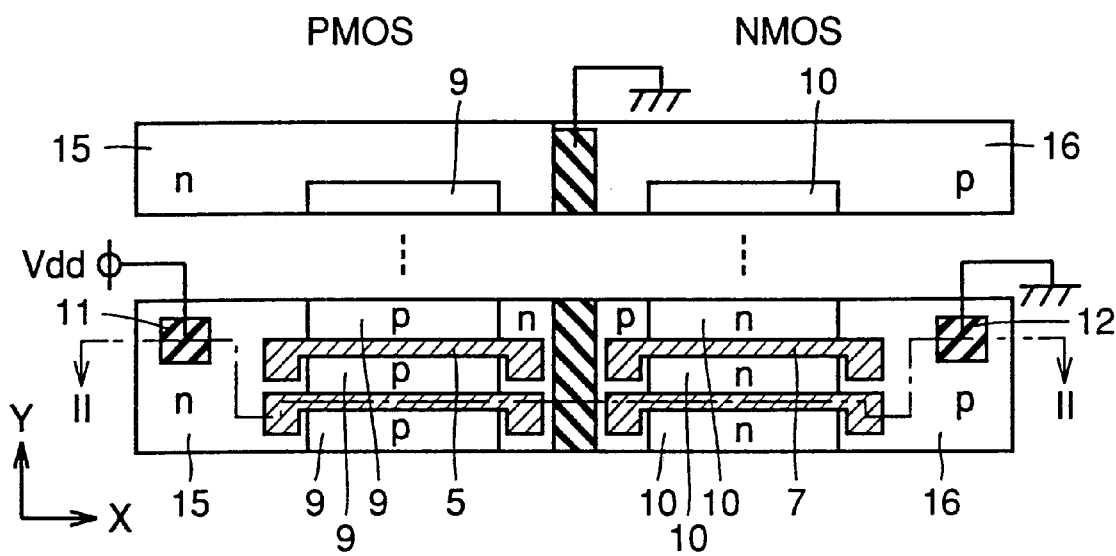
FIG. 1 is a top plan view of a transistor according to a first embodiment of the present invention.
Figure 2:
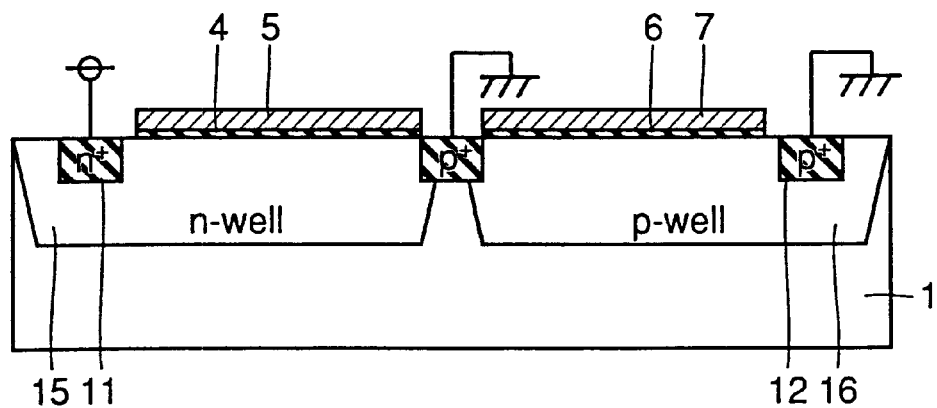
FIG. 2 is a cross sectional view taken along the line II—II in FIG. 1.

FIG. 1 is a top plan view of a transistor according to the first embodiment. FIG. 2 is a cross sectional view taken along the line II—II in FIG. 1.

Referring to FIGS. 1 and 2, a transistor according to the first embodiment includes a semiconductor substrate 1. A first gate electrode 5 and a second gate electrode 7 are disposed on semiconductor substrate 1, adjacent to each other in their gate width direction. A pair of p type source/drain layers 9 are disposed on the surface of semiconductor substrate 1, on both sides of first gate electrode 5 in the gate length direction Y. An n type, first gate width determining layer 15 for determining the gate width of first gate electrode 5 is disposed on the surface of semiconductor substrate 1 to sandwich p type source/drain layers 9 in the width direction X of the first gate electrode 5.

A pair of n type source/drain layers 10 are disposed on the surface of semiconductor substrate 1, on both sides of second gate electrode 7 in the gate length direction Y. A p type, second gate width determining layer 16 for determining the gate width of second gate electrode 7 is disposed on the surface of semiconductor substrate 1, to sandwich n type source/drain layers 10 in the width direction X of second gate electrode 7.

P type source/drain layers 9 and first gate width determining layer 15 are isolated by PN junction. N type source/drain layers 10 and second gate width determining layer 16 are isolated by PN junction. First gate width determining layer 15 is provided with $V_{DD}$ via a body contact region 11. Second gate width determining layer 16 is grounded via a body contact region 12.

The transistor according to the first embodiment employs reverse bias of PN junction, instead of using an oxide film, to determine the gate width of the gate electrode. Therefore, the structure requires no LOCOS isolation, and thus, there occurs no impurity diffusion into the oxide film, or no bird's beak is formed. Accordingly, a leakage current can be suppressed.

Second Embodiment

Now, a manufacturing method of a transistor shown in FIGS. 1 and 2 will be described.

Referring to FIGS. 1 and 2, n channel doping (with, P, As, for example) is conducted in a region for forming an n well region by photolithography and ion implantation, to form an n well 15 (which is also to be the first gate width determining layer). P⁻ channel doping (with, e.g., B) is also conducted in a region for forming a p well by photolithography and ion implantation, to form a p well 16 (which is also to be the second gate width determining layer). Next, a gate oxide film is formed on the surface of semiconductor substrate 1, and then a gate electrode film is formed thereon. These films are removed from unnecessary-portions by photolithography and etching, leaving the gate pattern. First gate electrode 5 and second gate electrode 7, as well as respective gate oxide films 4 and 6 thereunder are thus formed.

Thereafter, a pair of p type source/drain layers 9 are formed on both sides of first gate electrode 5 in the gate length direction Y, by photolithography and ion implantation. A pair of n type source/drain layers 10 are also formed on both sides of second gate electrode 7 in the gate length direction Y, by photolithography and ion implantation.

According to this method, LOCOS isolation is unnecessary for forming the gate width determining layers. Though some optimization of process conditions (material, film thickness, doping concentration or the like) may be required, it is unnecessary to largely alter the conventional conditions. According to the present invention, no birds' beaks are produced, and thus, the leakage current is decreased. In addition, the conventional step of forming the LOCOS oxide film is no longer required, and therefore, the number of process steps is reduced.

Third Embodiment

Figure 3:
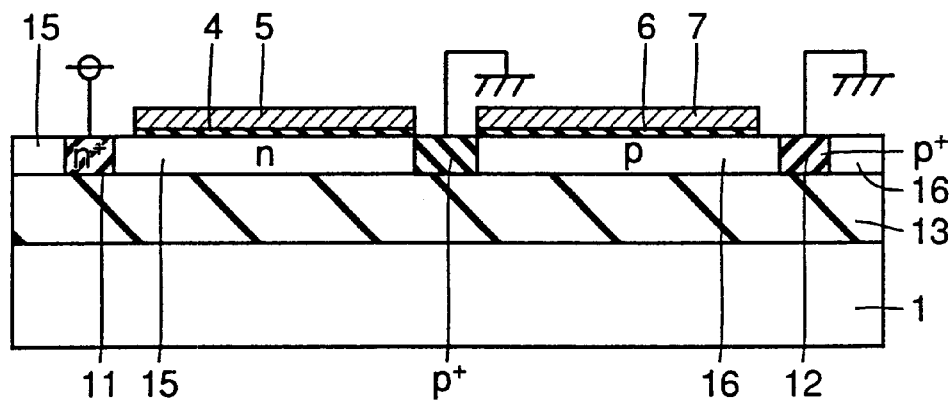
FIG. 3 is a cross sectional view of a transistor according to a third embodiment of the present invention.

FIG. 3 is a cross sectional view of a transistor according to the third embodiment. This transistor employs a SOI substrate as its semiconductor substrate. Otherwise, its configuration is identical to that of the transistor shown in FIGS. 1 and 2, and thus, same or corresponding portions are denoted by same reference numbers, and description thereof is not repeated.

An oxide film 13 is buried in semiconductor substrate 1. First gate width determining layer 15 and second gate width determining layer 16 are provided in the semiconductor layer, on oxide film 13. According to the present invention, a transistor that is capable of preventing a leakage current can be obtained even when the SOI substrate is employed.

Fourth Embodiment

In general, drain and source regions as well as gates are often covered with a material of high conductivity called silicide, to make their resistance small. At this time, there is a need to prevent silicification of certain portions in which silicification is unwanted, so as to prevent their resistance from decreasing. Thus employed is a method of preventing silicification of the portions where such silicification is undesired, by locally oxidizing those portions prior to the silicifying process. This method is called a silicide protection method.

The transistor according to the fourth embodiment utilizes this method.

Figure 4:
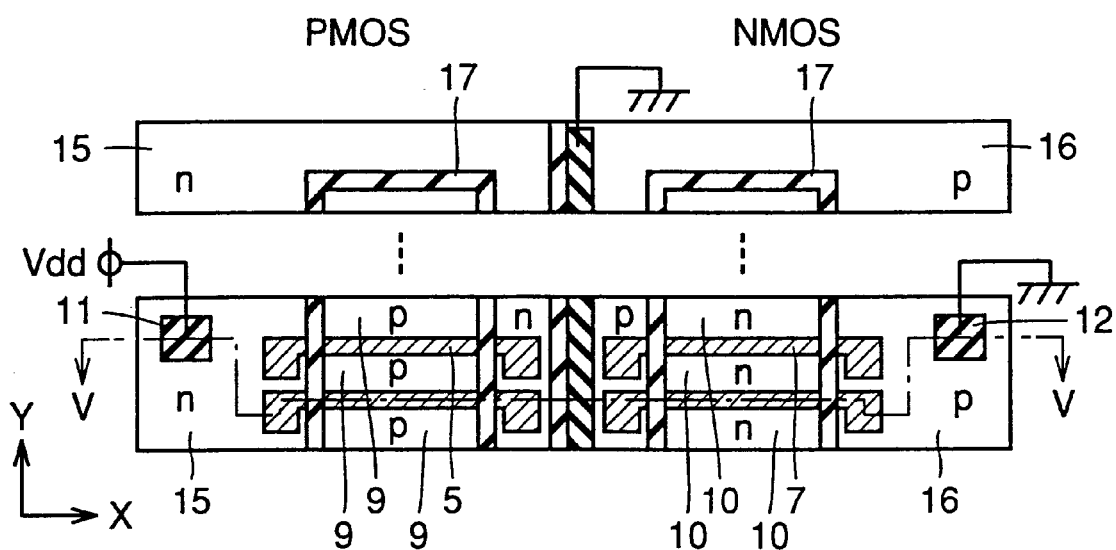
FIG. 4 is a top plan view of a transistor according to a fourth embodiment of the present invention.
Figure 5:
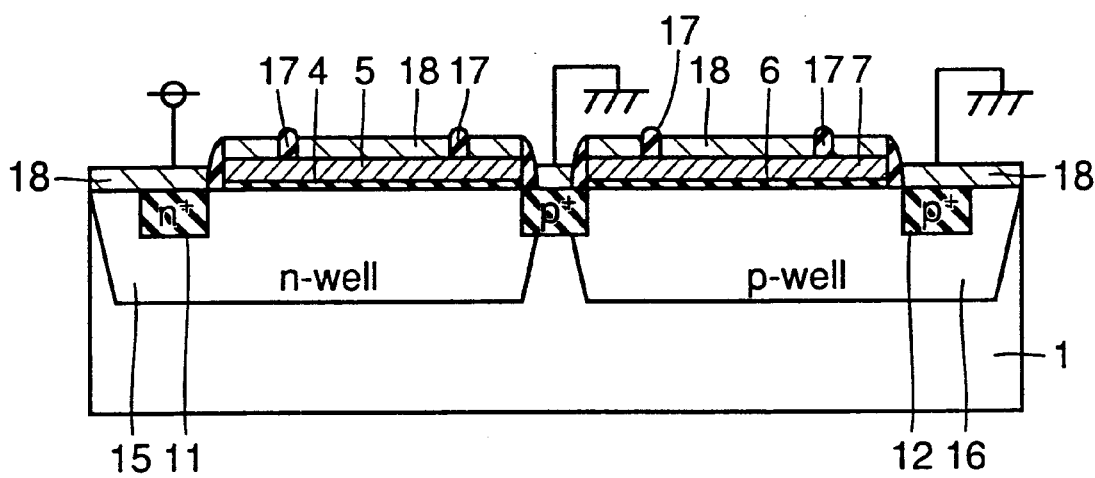
FIG. 5 is a cross sectional view taken along the line V—V in FIG. 4.

FIG. 4 is a top plan view of the transistor according to the fourth embodiment, and FIG. 5 is a cross sectional view taken along the line V—V in FIG. 4

The transistor shown in FIGS. 4 and 5 is identical to the transistor shown in FIG. 1 or 2, except the following points. Therefore, same or corresponding portions are denoted by same reference numbers, and description thereof is not repeated.

Specifically, referring to FIG. 4, the transistor according to the fourth embodiment is provided with a silicide prevention film (e.g., an oxide film) 17 on semiconductor substrate 1, continuously on and along the PN junction boundary, to prevent formation of silicide 18 thereunder.

If the reverse bias portion of PN junction is silicified in the transistor shown in FIGS. 1 and 2, there will occur short between the power supply and the ground through the silicide thus formed. The present embodiment is directed to solve this problem. The above-described silicide protection is provided on the boundary of PN junction, and thus, short between the power supply ($V_{DD}$) and the ground by silicide 18 as well as short between N region 15 and P region 16 by silicide 18 can be prevented.

Fifth Embodiment

Figure 6:
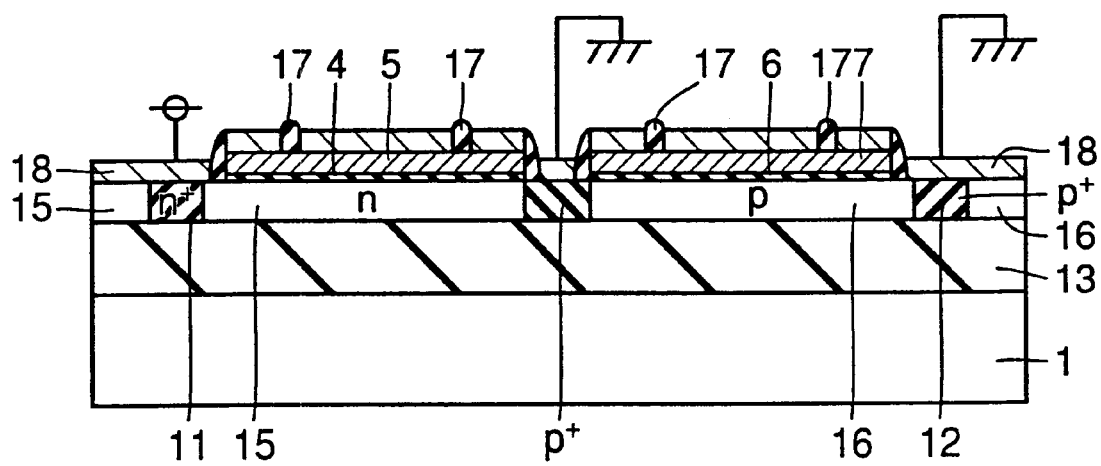
FIG. 6 is a cross sectional view of a transistor according to a fifth embodiment of the present invention.

FIG. 6 is a cross sectional view of the transistor according to the fifth embodiment. It is identical to the transistor shown in FIGS. 4 and 5 except that it employs a SOI substrate as the semiconductor substrate. Therefore, same or corresponding portions are denoted by same reference numbers, and description thereof is not repeated. According to the present embodiment, silicide protection 17 is provided, which prevents short between the power supply and the ground by silicide 18, even when the SOI substrate is used as the semiconductor substrate.

Sixth Embodiment

Figure 7:
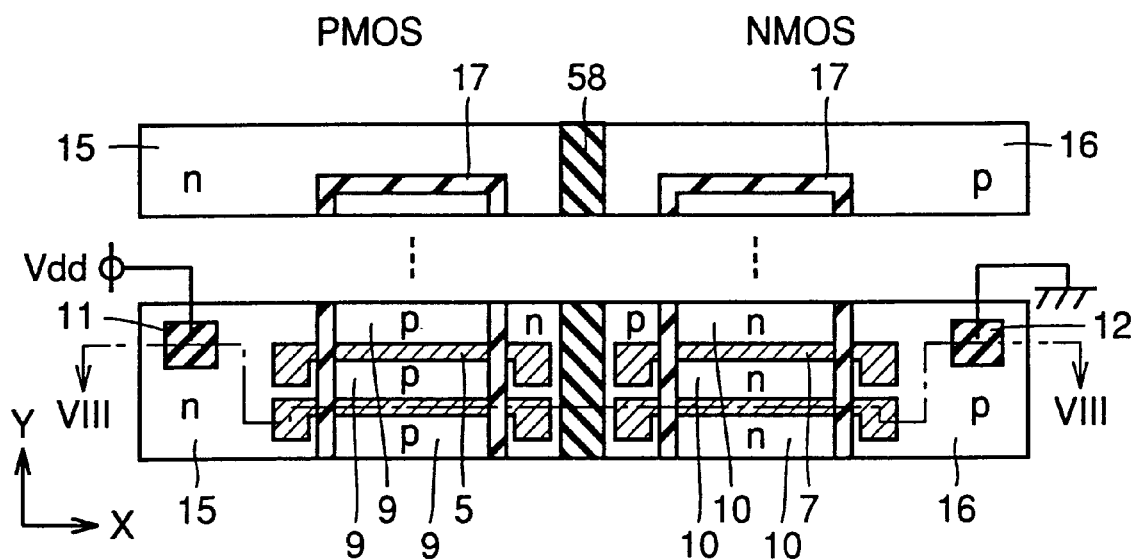
FIG. 7 is a top plan view of a transistor according to a sixth embodiment of the present invention.
Figure 8:
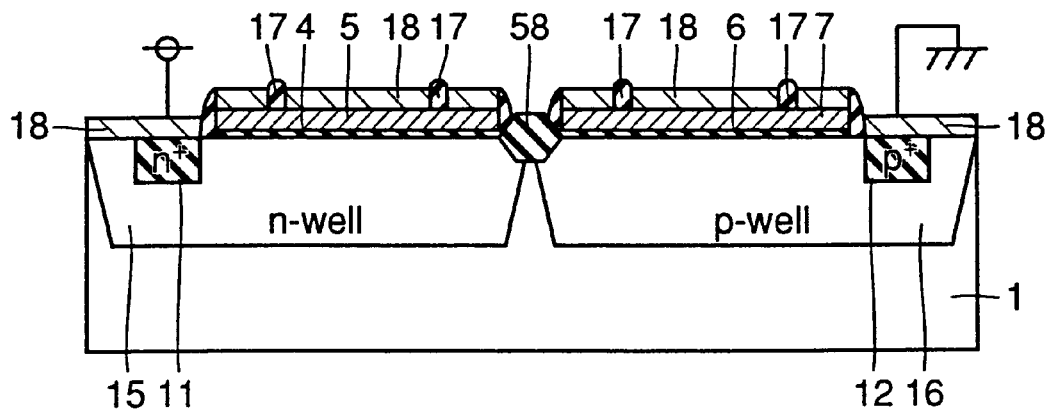
FIG. 8 is a cross sectional view taken along the line VIII—VIII in FIG. 7.

FIG. 7 is a top plan view of the transistor according to the sixth embodiment, and FIG. 8 is a cross sectional view taken along the line VIII—VIII in FIG. 7. The transistor shown in FIGS. 7 and 8 is identical to that in FIGS. 4 and 5, except for the points described below. Therefore, same or corresponding portions are denoted by same reference numbers, and description thereof is not repeated.

In the transistor according to the sixth embodiment, determination of the gate width of gate electrode 5 is made by reverse bias isolation of PN junction, instead of using a LOCOS oxide film, to prevent formation of a bird's beak. If an NMOSFET and a PMOSFET are isolated by the LOCOS isolation, the bird's beak will be formed. However, the bird's beak thus formed will not affect the leakage current. In contrast, isolation by the reverse bias of PN junction may cause a PN junction reverse bias current to flow.

The transistor according to the sixth embodiment is directed to solve this problem. Referring to FIG. 8, the NMOSFET and the PMOSFET are isolated by a conventional LOCOS oxide film 58. This configuration has advantages that it can prevent the PN junction reverse bias current as well as formation of a latch-up structure of PNPN. It also brings about an effect that the PMOSFET and the NMOSFET are reliably isolated.

Seventh Embodiment

Figure 9:
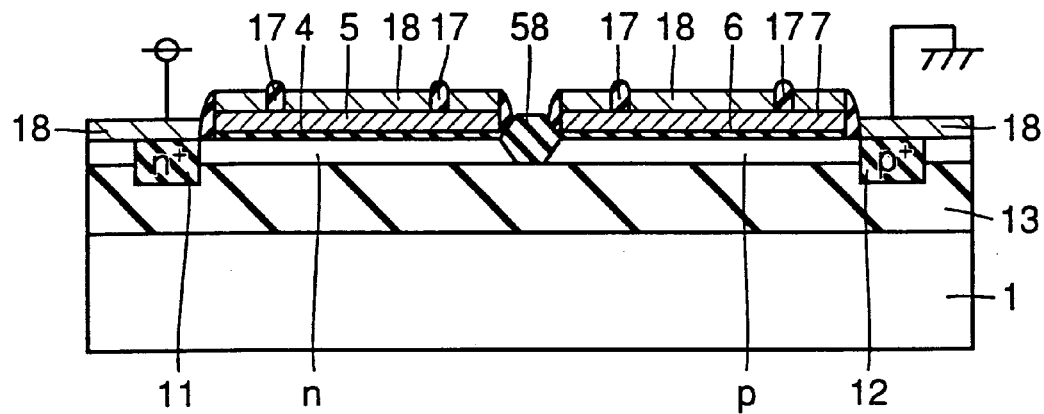
FIG. 9 is a cross sectional view of a transistor according to a seventh embodiment of the present invention.
Figure 10:
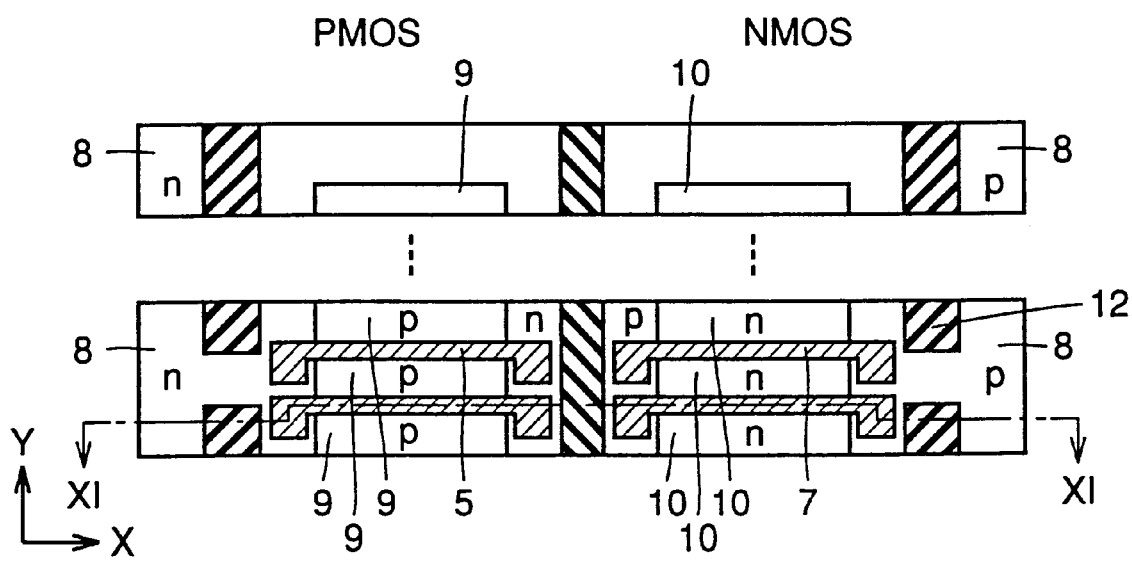
FIG. 10 is a top plan view of a conventional transistor.
Figure 11:
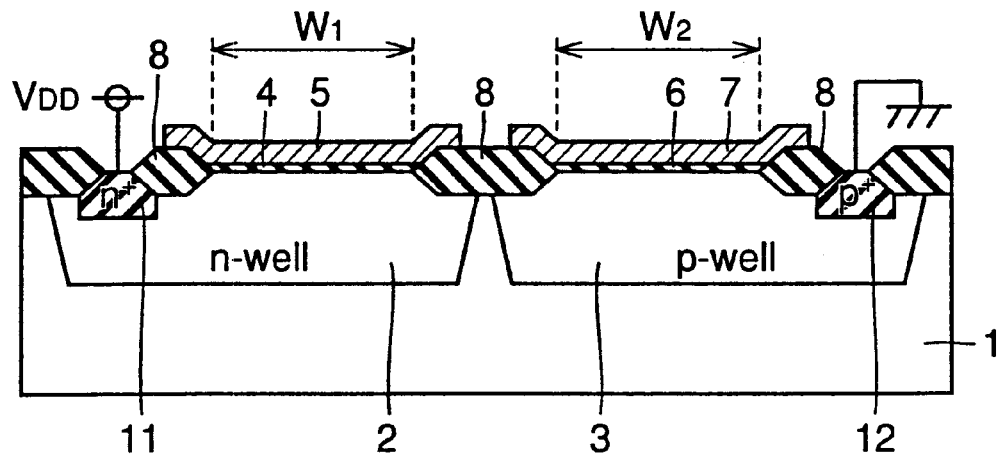
FIG. 11 is a cross sectional view taken along the line XI—XI in FIG. 10.
Figure 12:
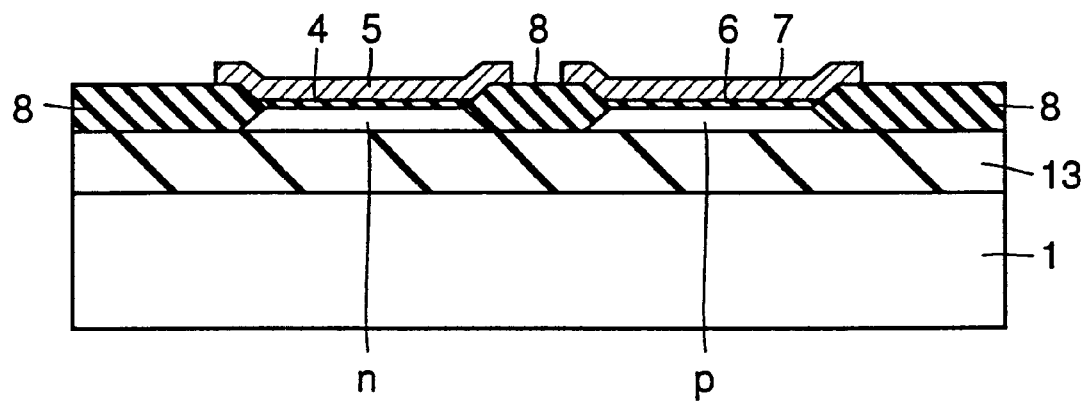
FIG. 12 is a cross sectional view of a conventional transistor employing a SOI substrate.
Figure 13:
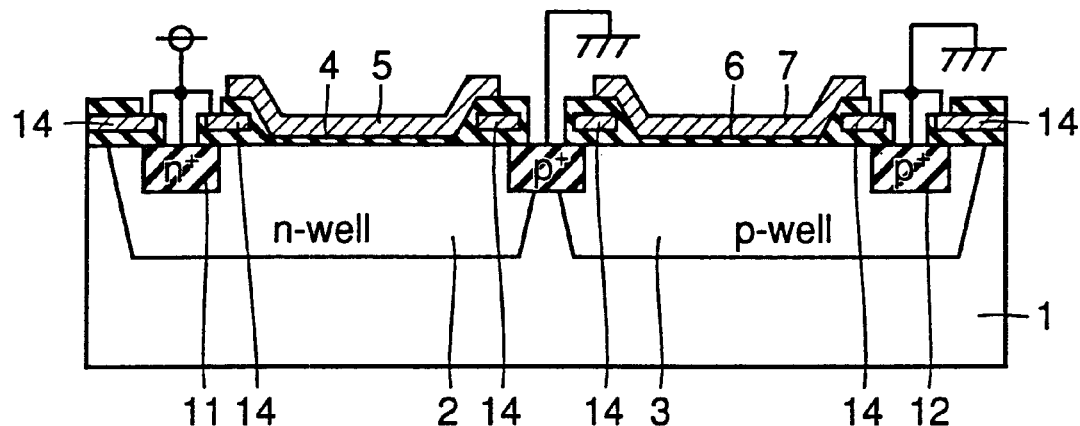
FIG. 13 is a cross sectional view of a conventional transistor using field shield isolation for determining the gate width of a gate electrode.
Figure 14:
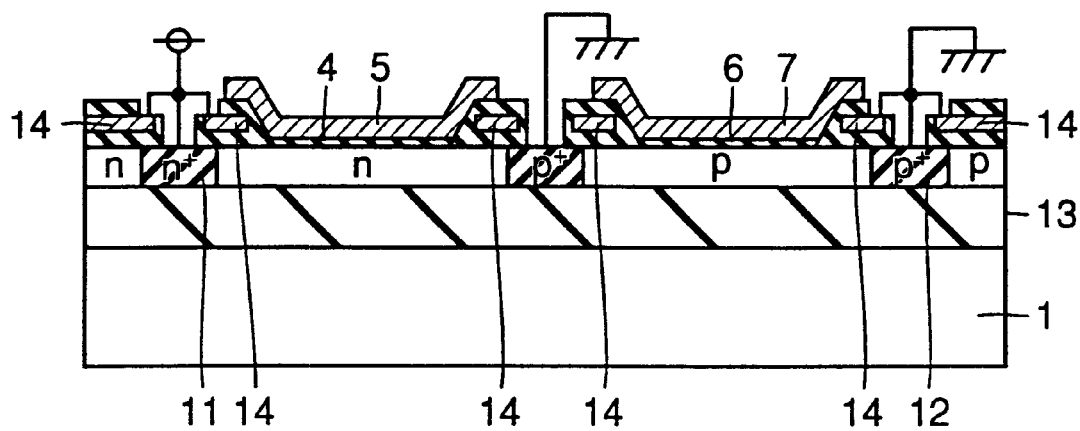
FIG. 14 is a cross sectional view of a conventional transistor using a SOI substrate and further using the field shield isolation for determining the gate width.

FIG. 9 is a cross sectional view of the transistor according to the seventh embodiment. The transistor according to the seventh embodiment is identical to that shown in FIGS. 7 and 8, except that it employs a SOI substrate as its semiconductor substrate. Thus, same or corresponding portions are denoted by same reference numbers, and description thereof is not repeated.

According to the present invention, a PN junction reverse bias current as well as a latch-up structure of PNPN can be prevented, even when the SOI substrate is employed. Further, isolation of the PMOSFET and the NMOSFET is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a substrate:
        a pair of source/drain layers of a first semiconductor conductivity type formed on a surface of said substrate;
        a gate width determining layer of a second semiconductor conductivity type formed on the surface of said substrate and being isolated by PN junction from said pair of source/drain layers, said gate width determining layer including a first portion sandwiched between said pair of said source/drain layers in a first direction, and second and third portions sandwiching said pair of source/drain layers and said first portion in a second direction vertical to said first direction;
        a first oxide film formed on the first portion of said gate width determining layer; and
        a gate electrode formed on said first oxide film.

2. The semiconductor device of claim 1, further comprising
    a second oxide film formed on at least a first boundary between said pair of source/drain layers and the second portion of said gate width determining layer and a second boundary between said pair of source/drain layers and the third portion of said gate width determining layer and
    a silicide film formed adjacent to said second oxide film.

3. The semiconductor device of claim 2, wherein
said substrate includes a semiconductor substrate and a third oxide film formed on said semiconductor substrate, said pair of said source/drain layers and said gate width determining layer formed on said third oxide film.

4. The semiconductor device of claim 1, wherein
said substrate includes a semiconductor substrate and a second oxide film formed on said semiconductor substrate, said pair of said source/drain layers and said gate width determining layer formed on said second oxide film.

5. The semiconductor device of claim 1, wherein
said gate width determining layer is isolated only by PN junction from said pair of source/drain layers.

6. The semiconductor device of claim 1, further comprising another pair of source/drain layers of the second semiconductor conductivity type formed on the surface of said substrate;
another gate width determining layer of the first semiconductor conductivity type formed on the surface of said substrate and being isolated by PN junction from said another pair of source/drain layers, said other gate width determining layer including a fourth portion sandwiched between said another pair of source/drain layers in a first direction, and fifth and sixth portions sandwiching said another pair of source/drain layers and said fourth portion in the second direction;
a second oxide film formed on the fourth portion of said another gate width determining layer;
another gate electrode formed on said second oxide film; and
a third oxide film sandwiched between said two gate width determining layers in said second direction and isolating said gate width determining layer from said another gate width determining layer.

7. The semiconductor device of claim 6, wherein
said substrate includes a semiconductor substrate and a fourth oxide film formed on said semiconductor substrate, and
said two pairs of said source/drain layers, said two gate width determining layers and said third oxide film are formed on said third oxide film.

8. The semiconductor device of claim 6, further comprising:
a fourth oxide film formed on at least a first boundary between said pair of source/drain layers and the second portion of said gate width determining layer and a second boundary between said pair of source/drain layers and the third portion of said gate width determining layer;
a fifth oxide film formed on at least a third boundary between said other pair of source/drain layers and the fifth portion of said gate width determining layer and a fourth boundary between said other pair of source/drain layers and the sixth portion of said gate width determining layer; and
fourth and fifth silicide films formed adjacent to said fifth oxide films, respectively.

9. The semiconductor device of claim 6, wherein said gate width determining layer is isolated only by PN junction from said pair of source/drain layers and said other gate width determining layer is isolated only by PN junction from said other pair of source/drain layers.

10. The semiconductor device of claim 1, further comprising:
a silicide prevention film preventing formation of silicide thereunder, said silicide prevention film including a portion formed on a part of said gate electrode and on a boundary between said pair of source/drain layers and the second portion of said gate width determining layer and a portion formed on another part of said gate 3 electrode and on a boundary between said pair of source/drain layers and the third portion of said gate width determining layer.

11. The semiconductor device of claim 1, further comprising:
a first silicide prevention film preventing formation of silicide thereunder, said silicide prevention film including a portion formed on a part of said gate electrode and on a boundary between said pair of source/drain layers and the second portion of said gate width determining layer and a portion formed on another part of said gate electrode and on a boundary between said pair of source/drain layers and the third portion of said gate width determining layer; and
a second silicide prevention film preventing formation of silicide thereunder, said second silicide prevention film including a portion formed on a part of said another gate electrode and on a boundary between said another pair of source/drain layers and a fifth portion of said another gate width determining layer and a portion formed on another part of said another gate electrode and on a boundary between said another pair of source/drain layers and the sixth portion of said another gate width determining layer.

* * * * *